United States Patent [19]

Tanagawa: Kouzi

[11] Patent Number: 4,967,415
[45] Date of Patent: Oct. 30, 1990

[54] EEPROM SYSTEM WITH BIT ERROR DETECTING FUNCTION

[75] Inventor: Tanagawa: Kouzi, Tokyo, Japan

[73] Assignee: OKI Electric Industry Co., Ltd., Tokyo, Japan

[21] Appl. No.: 245,296

[22] Filed: Sep. 16, 1988

[30] Foreign Application Priority Data

Sep. 18, 1987 [JP] Japan .................... 62-232526

[51] Int. Cl.$^5$ .................................. G06F 11/10
[52] U.S. Cl. ............................ 371/51.1; 371/6; 371/21.4
[58] Field of Search ............. 371/51.1, 6, 21.4; 365/200, 201

[56] References Cited

U.S. PATENT DOCUMENTS

| | | | |
|---|---|---|---|
| 4,016,409 | 4/1977 | Kim | 371/51.1 |
| 4,375,099 | 2/1983 | Waters et al. | 371/6 |
| 4,456,992 | 6/1984 | Schaub | 371/6 |
| 4,809,278 | 2/1989 | Kim et al. | 371/51.1 |

OTHER PUBLICATIONS

"Error Detecting and Correction Techniques for National Semiconductor's EEPROM Products", National Semiconductor Corp. Application Note 482, Non-Volatile Memory Databook '87, p2-84 88.

Primary Examiner—Charles E. Atkinson
Attorney, Agent, or Firm—Wenderoth, Lind & Ponack

[57] ABSTRACT

An EEPROM system with an error detecting function includes: a memory cell matrix composed of a plurality of MOS memory cells and a plurality of bit lines connected separately to the plurality of MOS memory cells; and a plurality of intermediate state detecting circuits connected separately to the plurality of bit lines for detecting an intermediate state other than writing and erasing states of the MOS memory cells, and for outputting an error bit indicating signal, the intermediate state being a threshold voltage between a threshold voltage of a storage MOS memory cell in a writing state included in each of the MOS memory cells and a threshold voltage of the storage MOS memory cell in an erasing state.

34 Claims, 6 Drawing Sheets

| OPERATION MODE | BIT LINE | WORD LINE | SENSE LINE | GROUND LINE |
|---|---|---|---|---|
| IN READING | 2 v | 5 v | 2 v | 0 v |
| IN ERASING | 0 v | 20 v | 20 v | 0 v |
| IN WRITING | 20 v | 20 v | 0 v | FLOATING |

VOLTAGE AT EACH PORTION (a)  (b)

EEPROM SYSTEM WITH BIT ERROR DETECTING FUNCTION

BACKGROUND OF THE INVENTION

1. Field of the Invention:

The present invention relates to a non-volatile semiconductor programmable ROM with a bit error detector included therein.

2. Description of the Prior Art:

An EEPROM is a non-volatile memory capable of electrical erasing and writing of information therein, and has found in recent years extensive application. For example, an IC card includes therein an EEPROM IC in the form of a chip for use in storage of important data (deposit information and health information, etc.) by a user. The EEPROM is therefore required for a function of detecting any bit error involved in data in order to correctly store such informations. To detect any bit error caused in the EEPROM, it is well known to add a parity bit to bits constituting a word. For example, Nikkei Electronics (Sept. 26, 1983) describes a principle for detection and correction of bit errors in "A high speed 1M bit mask ROM including therein an ECC circuit for improvement of the yield". Means to detect any error in data and indicate its position will here be described with reference to the Nikkei Electronics article.

FIG. 2 is a prior art EEPROM system having an error detecting circuit which includes memory cells each storing of 1 word-that is-bits of data. The EEPROM system comprises data memory cells 10 for storing data D0 to D3, a data read circuit 30 for reading the data D0 to D3 stored in the data memory cells 10, bit lines 11 respectively, connecting the data memory cells 10 to parts of the read circuits 30, logical output lines 12 respectively connected to the read circuits 30 for outputting the data read by the read circuits 30, parity memory cells 20 for storing parity bits, parity bit lines 21 connected between the parity memory cells 20 and the remaining parts of the read circuits 30, a bit error detecting circuit 2 composed of exclusive OR gates EOR1 to EOR3 each connected to the read circuits 30 via the logical output lines 12, and a position indicating circuit 1 composed of AND gates AND1 to AND4 connected to the exclusive OR gates EOR1 to EOR3 via logical output lines 22 for outputting error bit-indicating outputs e0 to e3, the AND gates AND1 to AND4 including therein parity data Po to P2. The EEPROM system is adapted to provide the three parity memory cells 20 correspondingly to the four memory cells 10 for each word, and, further provide the parity memory cells 20 which respectively store pieces of parity information that respectively form even parities between the bit lines 21 and lines perpendicular thereto (word lines in general). Here, for example, the parity bit Po has an even parity relationship with the data D0, D2, and D3, the parity bit P1 and also has an even parity relationship with the data D2, D1, and D3, and the parity bit P2 further also has an even parity relationship with the data D0, D1, and D2. The bit error detecting circuit 2, i.e., the exclusive OR gate EOR1 to EOR3 respectively output a logical "0" signal when the even parity condition holds, and otherwise output a logical "1" signal. For example, the exclusive OR gate EOR2 has the input bit lines D0, D1, and D3. Assumed here that D0="0", D1="0", D2="1", D3="0", P0="1", P1="0", and P2="1", the EOR2 outputs a "0", satisfying the even parity condition. This assures no error. Provided now the data D1 is assumed to have an error bit "1" at a bit position where it should have a bit "0" originally, the EOR2 outputs a "1" as a result of its logic and the EOR3 also outputs a "1", causing the AND2 in the error position indicating circuit 1 to output a "1". This shows that the data D1 has a bit error therein. The prior art EEPROM system with the error detecting circuit shown in FIG. 2 required three parity bits when the number of data bits consituting 1 word was equal to four, as described above.

On such a principle, (N+1) parity memory cells is generally needed for $2^N$ memory cells which constitute 1 word, to detect bit errors and to indicate bits in error. Additionally, the use of the even parity made it impossible to detect even bit errors. In other words, it was impossible to detect completely a plurality of errors involved in 1 word. From these reasons described above, the prior art EEPROM system with an error detecting circuit needed, upon fabrication thereof in a 1 word-8 bit construction, a 4 bit memory cell for each word, resulting in the total number of bits required to be increased by about 1.5 times in comparison to systems not including an error detecting circuit. The prior art EEPROM systems thus suffered from a problem in that the chip area was increased because of unsatifactory chip efficiency to cause an increase in the cost of the device. It further suffered from another problem in that there was an incomplete error detection for a plurality of bits.

SUMMARY OF THE INVENTION

In view of the drawbacks of the prior art, it is an object of the present invention to provide an EEPROM system with an error detecting function capable of the detection of any bit error and capable of the indication of a bit error position thereof in the data without the use of many parity memory cells each having insufficient chip efficiency.

Another object of the present invention is to provide an EEPROM system provided with an error detecting function capable of error correction for odd bits by additionally providing a 1 bit parity memory cell for each word.

Still another object of the present invention is to provide an EEPROM system provided with an error detecting function capable of the detection of any memory cell which has the possibility of inadvantageously becoming deteriorated in the near future.

In accordance with the first aspect of the present invention, an EEPROM system provided with an error detecting function comprises: a plurality of word lines; a plurality of sense lines; a plurality of MOS memory cells connected separately to the plurality of the word lines and to the plurality of the sense lines each for selecting one of the word lines and for storing data inputted therein through a selected one of said word lines; a plurality of bit lines connected separately to the MOS memory cells; a plurality of read circuits connected separately to the plurality of the bit lines for reading and outputting the data stored in the memory cells; and a plurality of intermediate state detecting circuits connected separately to the bit lines for detecting an intermediate state of each of the MOS memory cells other than writing and erasing states of the MOS memory cell and for outputting an error bit indicating signal.

Furthermore, in accordance with the second aspect of the present invention, an EEPROM system provided with an error detecting function comprises: a plurality of word lines; a plurality of sense lines; a plurality of MOS memory cells connected to the plurality of the word lines and to the plurality of the sense lines each for selecting one of the word lines and for storing data inputted therein through a selected one of said word lines; a parity check MOS memory cell for effecting parity check of 1 bit; a plurality of bit lines connected separately to the MOS memory cells and to the parity check MOS memory cell; a plurality of read circuits connected separately to the bit lines for reading and outputting the data stored in the memory cells; a plurality of intermediate state detecting circuits connected separately to the bit lines for detecting an intermediate state of each of the MOS memory cells other than writing and erasing states of the MOS memory cells and for outputting an error bit indicating signal, the intermediate state being a threshold potential between a threshold potential of the storage MOS memory cell in a writing state and a threshold potential of the storage MOS memory cell in a erasing state; and the plurality of intermediate state detecting circuits including an intermediate state detecting circuit connected to the parity check MOS memory cell for detecting the intermediate state other than the writing and erasing states of the parity check MOS memory cell and for outputting a parity check error bit indicating signal.

The above and other objects, features and advantages of the present invention will become more apparent from the following description when taken in conjunction with the accompanying drawings in which preferred embodiments of the present invention are shown by way of illustrative example.

DESCRIPTION OF THE PREFERRED EMBODIMENT

In what follows, an embodiment of an EEPROM system provided with an error detecting function will be described with reference to the accompanying drawings.

First, the arrangement and operation of a memory cell constituting the EEPROM system will be described with reference to FIGS. 3(a), 3(b), 4, and 5.

Figure 4:
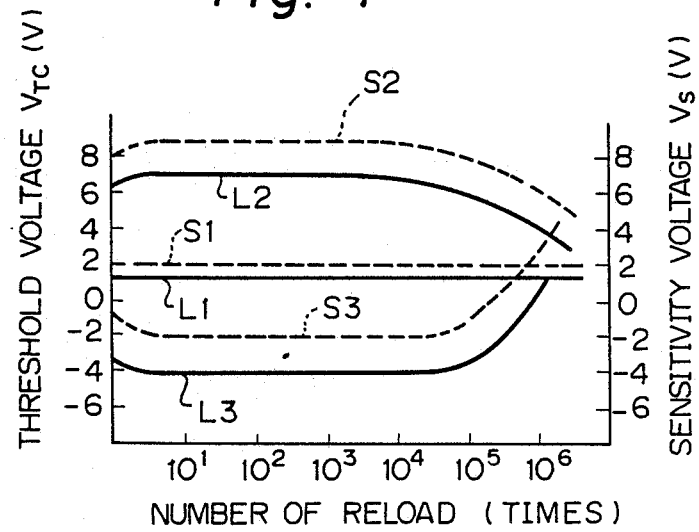
FIG. 4 is a view illustrating the characteristics of threshold voltage $V_{TC}$ and sensitivity voltage Vs of a read circuit with respect to the number of reloads of information in the memory cell of FIG. 1.
Figure 2:
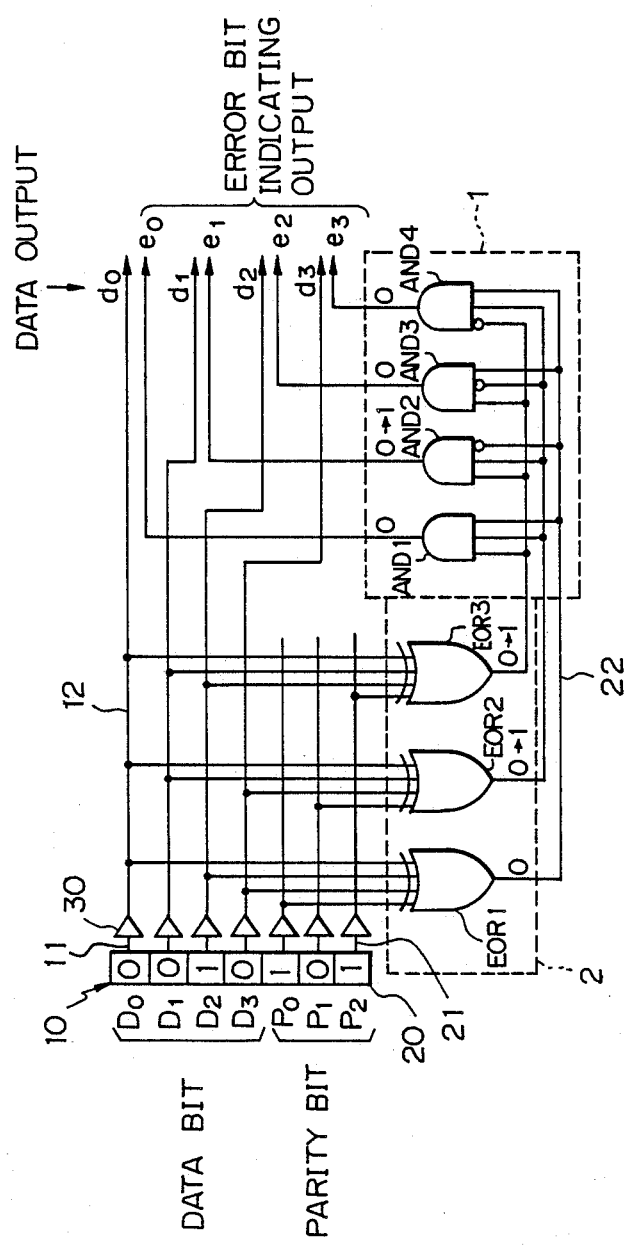
FIG. 2 is a circuit diagram illustrating a portion of a prior art EEPROM system provided with an error detecting function.
Figure 5:
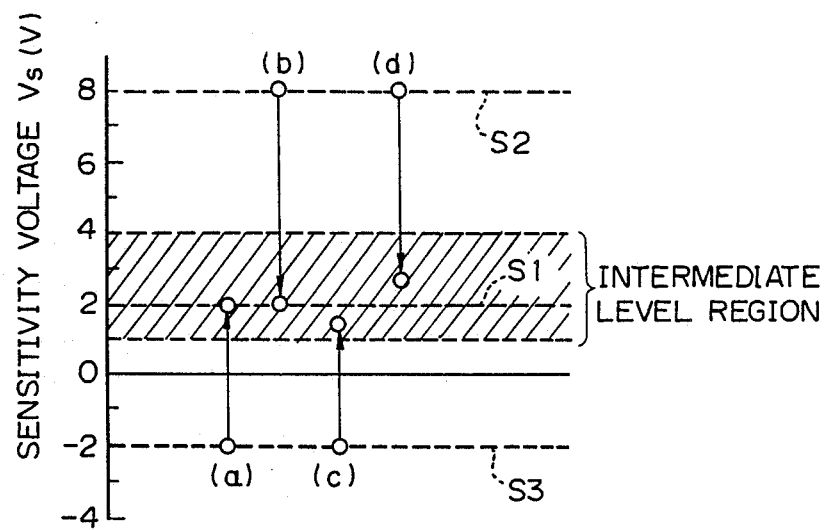
FIG. 5 is a view illustrating the change in the sensitivity voltage Vs of the read circuit.

FIG. 3(a) is an equivalent circuit diagram of the memory cell for use in the EEPROM system, and FIG. 3(b) is a view illustrating the operating conditions of read, erase, and write of the memory cell. FIG. 4 is a view illustrating the characteristics of threshold voltage $V_{TC}$ of the memory cell and sensitivity voltage Vs of a read circuit both with respect to the number of times of writing of information into the memory cell, and FIG. 5 is a view illustrating a change in the sensitivity voltage Vs of the read circuit.

The arrangement and operation of the memory cell is described for example in "16K bit EEPROM electrically erasable in a byte unit", Nikkei Electronics, No. June 23, 1980, pp 198 to 207.

Referring to FIG. 3(a), the memory cell includes a data selection MOS transistor Q1, and a storage memory MOS transistor Q2 of the type having a double-layered polysilicon gate, both transistors being connected in series and the latter transistor having a floating gate 17.

The data selection MOS transistor Q1 has a first electrode coupled to a bit line 14, a second electrode coupled to the memory MOS transistor..Q2, and a gate electrode coupled to a lead line 15. The memory MOS transistor Q2 has a first electrode coupled to the second electrode of the data selection MOS transistor Q1, a gate electrode coupled to a sense (or program) line 16, the floating gate electrode 17, and a second electrode coupled to a ground line 13.

The storage MOS transistor Q2 forms a thin oxide film (tunneling oxide film) between the first electrode (drain) thereof and the floating gate 17, through which electrons and holes are injectd into the floating gate 17 for erase and write operations.

Referring further to FIG. 3(b), voltages at respective portions of the memory cell are assumed in a read operation, for example, to be as follws: 2V on the bit line 14, 5V on the word line 15, 2V on the sense line 16, and a ground potential on the ground line 13.

Here, accumulation of electrons on the floating gate 17 of the storage MOS transistor Q2 allows the threshold voltage $V_{TC}$ for the storage MOS transistor Q2 to be raised. For this, the storage MOS transistor Q2 is turned off when the threshold voltage $V_{TC}$ is above the potential of the sense line 16, while it is turned on when the $V_{TC}$ is below the same potential.

Referring to the same figure, the voltages at the respective portions of the memory cell are assumed in the erase operation, for example, to be as follows: 0V on the bit line 14, a high voltage (e.g. 20V) on the word line 15, 20V on the sense line 16, and 0V on the ground line 13. The floating gate 17 of the storage MOS transistor Q2 is thereby injected with electrons through the tunneling effect because of a sufficiently high voltage being induced between the floating gate 17 and the first gate. This causes the threshold voltage $V_{TC}$ of the storage MOS transistor Q2 to be raised.

Furthermore, referring to the same figure, the voltages at the respective portions of the memory cell are assumed in the write operation, for example, to be as follows: 20V on the bit line 14, 20V on the word line 15, 0V on the sense line 16, with the ground line kept at the floating state. The floating gate 17 is thereby forced to release therefrom the electrons accumulated thereon to a substrate and is instead injected with holes from the substrate. This causes the threshold voltage $V_{TC}$ of the storage MOS transistor Q2 to be lowered.

Referring to FIG. 4, changes in the threshold voltage $V_{TC}$ of the memory cell and in the sensitivity voltage Vs of a read circuit with respect to the number of times of a reloading operation for the memory cell will be described. In this situation, the conditions of the voltage applied to the memory cell and the write time into the memory cell are kept unchanged. In the figures, a line L1 shows the threshold voltage $V_{TV}$ (e.g., 1V) of the memory cell when no charge is accumulated on the floating gate 17 (neutral), with a line L2 showing the threshold voltage $V_{TC}$ after the erase operation and a line L3 showing the same voltages after the write operation. As ilustrated in the figure, repeated reload operations produce trapping levels for electrons and holes in the tunneling oxide film, which causes deterioration of the characteristics of the memory cell such as reduction of the threshold voltage thereof, reduction of an interval to hold information therein, and lowering of the dielectric voltage of the gate insulating films involved, etc. Reload times of $10^3$ cause no change in the threshold voltage $V_{TC}$, but those of $10^4$ permit $V_{TC}$ to start to be reduced.

In the memory cell having the characteristics shown by the lines L2, and L3 of FIG. 4, the application of 2V to the sense line 16 upon the read operation causes a current to flow through the memory cell from the bit line. A read circuit (sense amplifier) described later senses and amplifies the current. In general, a large current flowing through the memory cell (this occurs in a write state) is outputted as a logic "0", while a small current (this occurs in an erase state) is outputted as a logic "1". The sensitivity current (corresponding to the sensitivity voltage Vs of the sense line 16) of the read circuit (sense amplifier) is typically set to be larger than that flowing when the threshold voltage $V_{TC}$ is applied to the gate of the storage MOS transistor Q2. As illustrated in FIG. 4, the sensitivity voltage Vs upon the threshold voltage $V_{TC}$ being 1V (refer to the line L1) is 2V, and hence, the application of a voltage 3V to the sense line 16 causes the sense amplifier (not shown) connected to the bit line 14 to invert its output logic. In the same fashion, with the threshold voltage $V_{TC}$ along the line L2, the sensitivity voltage Vs is about 8V, for example, (refer to a line S2), and with the $V_C$ along the line L3, the Vs is about −2V, for example, (refer to a line S3).

Here, a change in the threshold voltage $V_{TC}$ of the memory cell having such characteristics will be described, the change being produced owing to insufficient dielectric voltage of the oxide film and a leakage current through pin holes of the film.

As illustrated in FIG. 5, the sensitivity voltage Vs of the sense amplifier (not shown) is varied owing to the change in the threshold voltage of the MOS memory cell. In FIG. 5(a), when the memory cell in the write state is deteriorated to release completely charges accumulated thereon, the sensitivity voltage Vs is changed from −2V (refer to the line S3) to 2V (refer to the line S1). Additionally, in FIG. 5(b) when the memory cell in the erase state releases completely changes accumulated thereon, the sensitivity voltage Vs is changed from 8V (refer to the line S2) to 2V (refer to the line S1). The principle of the present invention is to utilize a fact that when the memory cell in the write or erase state releases parity charges accumulated thereon, the sensitivity voltage Vs does not cross a potential of 2V, for example, as shown in FIGS. 5(d) and (c).

An intermediate detecting circuit (bit error detecting circuit) according to the present invention is adapted to output an error signal as the MOS memory cell including therein any factor of faults or the possibility of becoming any complete fault state in near future, when the threshold voltage $V_{CT}$ (or the sensitivity voltage $V_S$) lies in the vicinity of the intermediate level (e.g., line $S_1$) upon the read operation of the storage MOS transistor.

Figure 1:
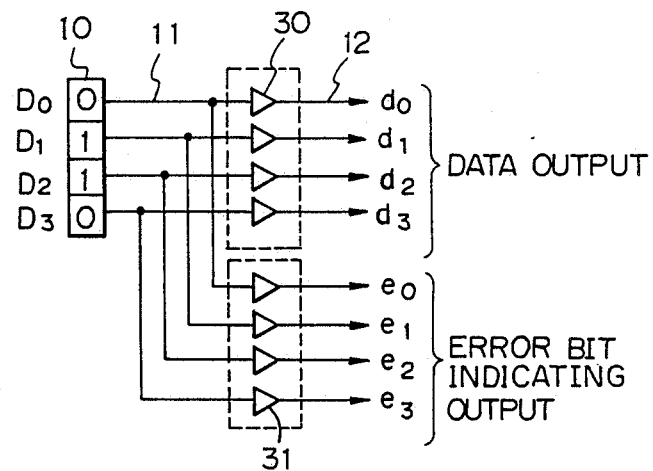
FIG. 1 is a circuit diagram illustrating a portion of an embodiment of an EEPROM system provided with an error detecting function according to the present invention.

In the following, the embodiment of the EEPROM system including such an intermediate state detecting circuit (bit error detecting circuit) will be described with reference to FIG. 1. FIG. 1 illustrates part of the EEPROM system.

Referring to FIG. 1, the EEPROM system includes a memory matrix 10 composed of memory cells D0, D1, D2, and D3 for storing and outputting word information and a plurality of bit lines 11, and a plurality of read circuits 30 connected to the respective bit lines 11. The EEPROM system further includes a plurality of intermediate state detecting circuits 31 (bit error detecting circuits) connected to the respective bit lines 11 for outputting error bit indicating signals e0, e1, e2, and e3. Each of the memory cells D0, D1, D2, and D3 includes a selection MOS transistor Q1 and a storage MOS transistor Q2, as illustrated in FIG. 3(a) for example.

Figure 8:
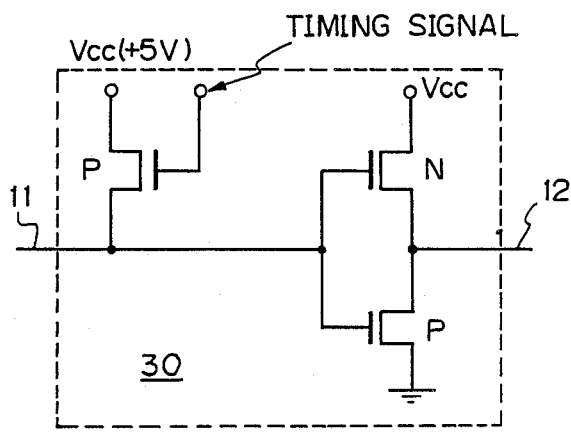
FIG. 8 is a circuit diagram illustrating a read circuit of FIG. 1.

The read circuit 30 includes a CMOS inverter and a PMOS transistor as illustrated in FIG. 8.

The intermediate state detecting circuit 31 includes an NMOS transistor 43 composed of a gate electrode connected to one of the plurality of the bit lines 11, a first electrode, and a second electrode connected to a ground potential. The intermediate state detecting circuit 31 further includes a PMOS transistor 41 composed of a first electrode connected to a power supply $V_{cc}$, a second electrode, and a gate electrode, a resistor means 42 connected to the second electrode of the PMOS transistor 41 and the first electrode of the NMOS transistor 43; a MOS load means 40 connected between the power supply $V_{cc}$ and the gate electrodes of the PMOS transistor 41 and the NMOS transistor 43; and an AND gate 45 connected to, at on input thereof, the second electrode of the PMOS transistor 41 and connected, at the other input, to the first electrode of the NMOS transistor 43 via an inverter 44. The intermediate state detecting circuit 31 outputs a logic "0" when the memory cell is at the write and erase states (i.e., $S_2$ or $S_3$ in FIG. 4), while outputting a logic "1" when it is at the intermediate state (i.e., $S_1$, 1 to 4 V for example), as illustrated in FIG. 5. The NMOS transistor 43 inputs a signal from the bit line 11, and the AND gate 45 outputs an 1 bit error indicating signal corresponding to the associated bit line 11.

Figure 3:
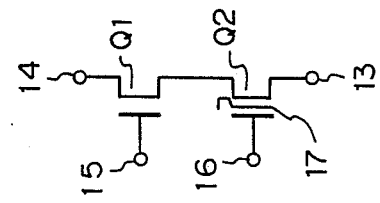
FIG. 3(a) is an equivalent circuit diagram of a memory cell for use in the EEPROM system of FIG. 1.
FIG. 3(b) is a view illustrating operating conditions of read, erase, and write for the EEPROM system of FIG. 1.

In succession, operation of the first embodiment will be described with reference to FIGS. 1, 3, and 6.

Referring to FIG. 1, the first embodiment of the EEPROM system with an error detecting function of the present invention is shown. In FIG. 1, the read circuit 30 is set, as the sensitivity voltage $V_s$, to the read potential $S_1$ (e.g., 2V) where no charge is accumulated on the floating gate of the memory cell 10. The intermediate state detecting circuit 31 is set, as the threshold level, to the intermediate potential (e.g., 1 to 4V). The intermediate state detecting circuit 31 thereby outputs a logic "1" when the bit lines 11 are at 1 to 4 volts, while outputting a logic "0" when they are above 4V (erasing state) or below 1V (writing state).

Figure 6:
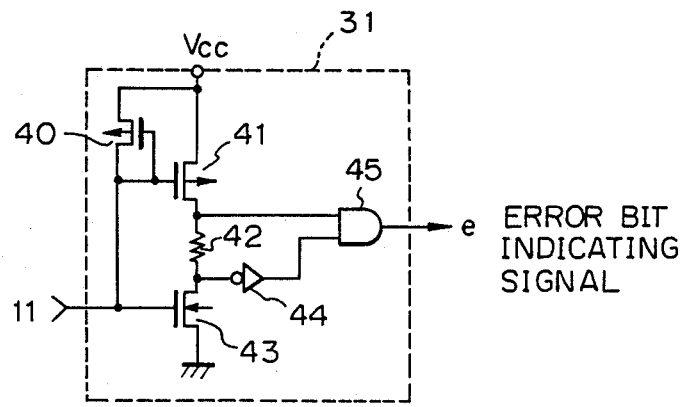
FIG. 6 is a circuit diagram of an intermediate state detecting circuit of FIG. 1.

Referring to FIG. 6, the intermediate state detecting circuit 31 is shown. As illustrated in the figure, the intermediate state detecting circuit 31 allows, when the bit line 11 is at 1 to 4V, the AND gate 45 to output a logic "1" (error indicating signal) because the P and N transistors 41 and 43 are conductive. When the bit line 11 is less than 1V or more than 4V, the AND gate 45 outputs a logic "0".

Here, in the EEPROM system of FIG. 1, it is assumed that data "0110" is stored in the memory cells D0 to D3 in the memory cell matrix 10, and the memory cell is faulty so that the bit lines 11 upon read operation are at the intermediate potential (e.g., the state of FIG. 5(b). In this situation, the read circuits 30 output 1 word data "0110" as output data d0 to d3, while the intermediate state detecting circuits 31 outputting data "0100" as bit error indicating output data, thus informing us of a fact that the bit of the memory cell $d_l$ will be deteriorated (i.e., changed to an error bit in future). This assures not only the indication of the bit error as described above, but also the utilization of the bit error indicating signal for correction of the error produced in the 1 word data (4 bits). Also, when the intermediate potential on the bit line 11 is less than the sensitivity voltage of the read circuit as shown in FIG. 5(c), a bit error indicating signal is outputted alike.

In the following, a second embodiment of the EEPROM system with an error detecting function of the present invention will be described with reference to FIG. 7.

Figure 7:
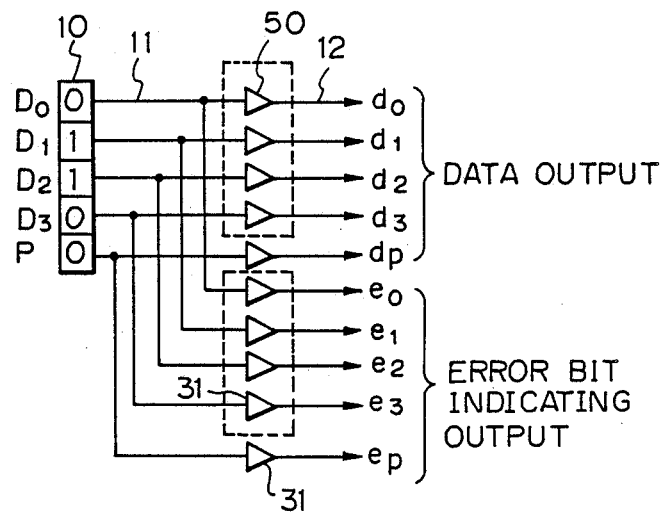
FIG. 7 is a circuit diagram illustrating a portion of a second embodiment of the EEPROM system provided with the error detecting function according to the present invention.

As illustrated in FIG. 7, the second embodiment includes, additionally to the first embodiment of FIG. 1, a parity memory cell provided in the memory cell matrix 10 for checking 1 bit parity, an additional read circuit 50 connected to the parity memory cell P, and an additional intermediate state detecting circuit 60 connected to the parity memory cell P.

Figure 9:
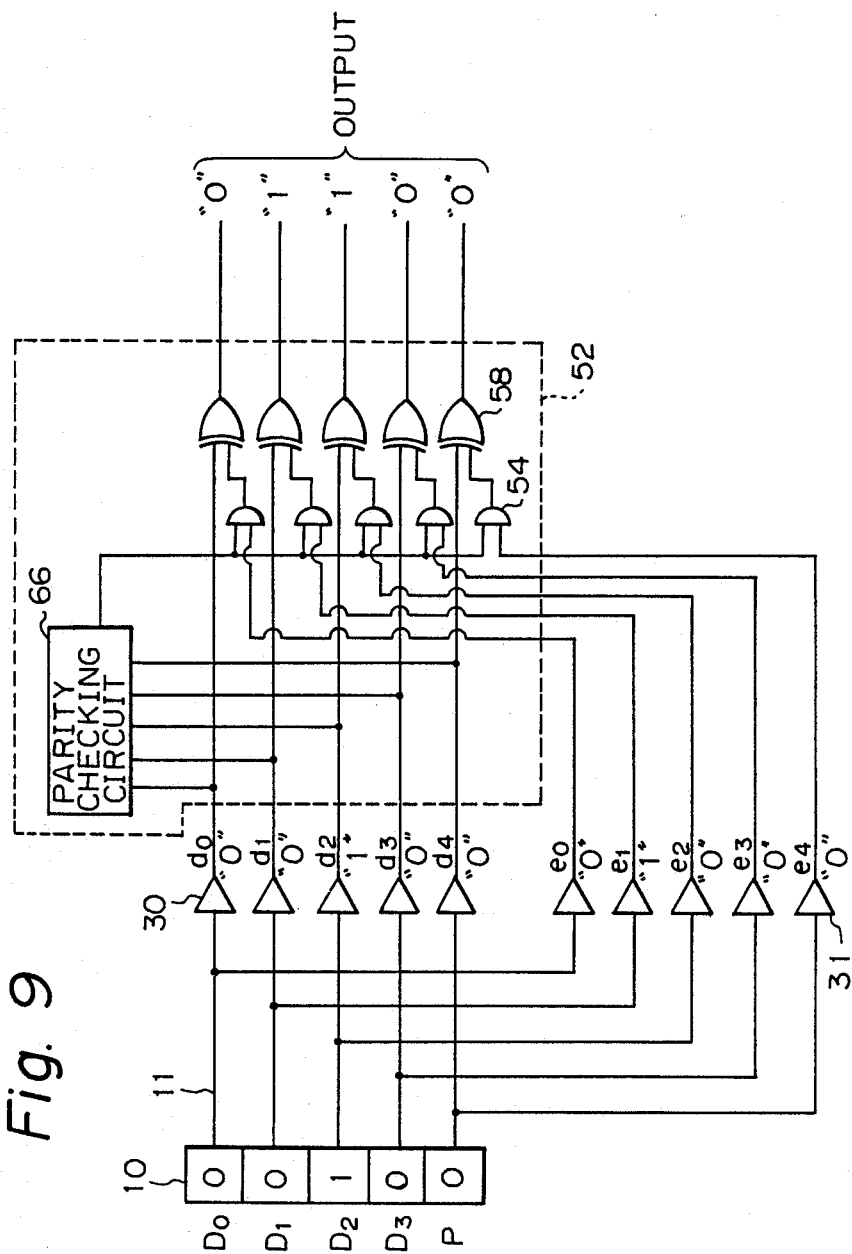
FIG. 9 is a circuit diagram illustrating a 1 bit correcting circuit.

With the arrangement described above, the bit signals $d_0$ to $d_p$ and the error bit indicating outputs $e_0$ to $e_3$ on logical output lines 12 corresponding to the respective memory cells are inputted together with a parity bit error indicating signal $e_p$ into a bit correcting circuit 52, for example, as illustrated in FIG. 9.

The bit correcting circuit 52 includes, for example, a parity checking circuit 66, a plurality of EOR gates 58, and a plurality of AND gates 54, for correcting any error bit.

The second embodiment of the EEPROM system of FIG. 7 also assures an error detecting and indicating signal when the threshold voltage of a fault memory cell is equal to the sensitivity voltage of the read circuit, and the threshold voltage of the memory cell is changed from a high potential to a predetermined intermediate level or less or from a low potential to the intermediate level or more. For example, when the memory cell D1 becomes an error state with its threshold value becoming the intermediate level (equal to or less than the sense level of the read circuit as shown in FIG. 5(d) for example), the read circuits $d_0$ to $d_4$ output read data "00100" including a parity bit. The parity check circuit 60, since the parity bit output is "0", effects the parity check and outputs a logic "1" if there are an odd number of "1s", informing us of a fact that a bit of the read data involves an error. The position of the error bit can be identified because of the error bit indicating output is "01000" and hence the memory all D1 output is erroneous. Thereupon, the bit correcting circuit 60 inverts the output from the read circuit $d_1$ and outputs "01100" as a correct word.

Thereupon, correct data of the parity check may be set in a register (not shown) for use as corrected data. Thereupon, the addition of an 1 parity bit to the data enables, differing from the prior art, an error of the memory cell at the states of FIG. 5(a) and (b) to be detected irrespective of the number of bits constituting 1 word. The parity bit error signal $e_p$ shown in FIG. 7 is employed as a control signal for the bit correcting circuit.

According to the present invention, as described above, bit line potentials are detected upon reading the EEPROM system, and an error signal is outputted provided those potentials are at the intermediate state. This requires less parity bits for detection and correction of any error, differing from the prior art where many parity bits should be added. That is, the first embodiment of FIG. 1 requires no parity bit for correction of data, together with error detection for a plurality of bits. Additionally, the second embodiment of FIG. 7 can effect error correction using 1 bit parity for 1 word also from a state where charges are completely released. This sharply reduces a chip area of an EEPROM provided with an error detecting function, the reduction amounting to 33% compared with a typical prior art system.

Although certain preferred embodiments have been shown and described, it should be understood that many changes an modifications maY be made therein without departing from the scope of the appended claims.

What is claimed is:

1. A memory device comprising:
   (a) a plurality of word lines;
   (b) a plurality of sense lines;
   (c) a plurality of MOS memory cells connected separately to said word lines and said sense lines;
   (d) a plurality of bit lines connected separately to said MOS memory cells;
   (e) a plurality of read circuits connected separately to said plurality of the bit lines for reading and outputting data stored in said MOS memory cells; and
   (f) a plurality of intermediate state detecting circuits connected separately to said bit lines each for detecting an intermediate state of one of said MOS memory cells other than writing and erasing states of said memory cells and for outputting an error bit indicating signal in response thereto.

2. A memory device according to claim 1, wherein said intermediate state is a threshold voltage between a threshold voltage of each of said MOS memory cells in a writing state and a threshold voltage of each of said MOS memory cells in an erasing state.

3. A memory device according to claim 1, wherein said MOS memory cell comprises a selection MOS transistor and a storage MOS transistor, said selection MOS transistor comprising a first electrode connected to the bit line, a gate electrode connected to the word line, and a second electrode, and said storage MOS transistor comprising a first electrode connected to said second electrode of said selection MOS transistor, a second electrode connected to a ground line, and a gate electrode connected to the sense line.

4. A memory device according to claim 1, wherein said intermediate state detecting circuit comprises:
   (a) a NMOS transistor composed of a gate electrode connected to one of the plurality of said bit lines, a first electrode, and a second electrode connected to a ground potential;
   (b) a PMOS transistor composed of a first electrode connected to a power supply, a second electrode, and a gate electrode;
   (c) a resistor means connected between said second electrode of said PMOS transistor and said first electrode of said NMOS transistor;
   (d) an MOS load means connected between said power supply and said gate electrodes of said PMOS transistor and NMOS transistor; and
   (e) an AND gate connected to, at one input thereof, said second electrode of said PMOS transistor and connected to, at another input thereof, said first electrode of said NMOS transistor via an inverter for inputting the voltage of said second electrode of said PMOS transistor and the inverted voltage of that at said first electrode of said NMOS transistor and for outputting said error indicating signal.

5. A memory device comprising:
   (a) a plurality of word lines;
   (b) a plurality of sense lines;
   (c) a plurality of MOS memory cells connected to said plurality of the word lines and to said plurality of sense lines each for selecting one of said word lines and for storing data inputted therein through a selected one of said word lines;
   (d) a parity check MOS memory cell for adding a 1 parity bit to the associated data;
   (e) a plurality of bit lines connected separately to said MOS memory cells and to said parity check MOS memory cell;
   (f) a plurality of read circuits separately connected to said bit lines for reading and outputting said data stored in said MOS memory cells;
   (g) a plurality of intermediate state detecting circuits connected separately to said bit lines for detecting an intermediate state of said MOS memory cells other than write and erase states of said MOS memory cells and for outputting an error bit indicating signal in response thereto; said intermediate state being a threshold voltage between a threshold voltage of each of said MOS memory cells in a writing state and a threshold voltage of each of said MOS memory cells in an erasing state;
   (h) wherein said intermediate state detecting circuit connected to said parity check MOS memory cell for detecting said intermediate state other than the writing and erasing states of said parity check MOS memory cell outputs a parity check error bit indicating signal.

6. A memory device according to claim 4, wherein said MOS memory cell comprises a selection MOS transistor and a storage MOS transistor both connected in series, said selection MOS transistor including a first electrode connected to the bit line, a gate electrode connected to the word line, and a second electrode, said storage MOS transistor including a first electrode connected to the second electrode of said selection MOS transistor, a gate electrode connected to the sense line, and a second electrode connected to a ground line.

7. A memory device according to claim 4, wherein said intermediate state detecting circuit comprises:
   (a) an NMOS transistor composed of a gate electrode connected to one of said plurality of bit lines, a first electrode, and a second electrode connected to the ground potential;
   (b) a PMOS transistor composed of a first electrode connected to a power supply, a second electrode, and a gate electrode;
   (c) a resistor means connected to said second electrode of said PMOS transistor and said first electrode of said NMOS transistor;
   (d) an MOS load means connected between said power supply and said gate electrodes of said PMOS transistor and said NMOS transistor; and
   (e) an AND gate connected to, at one input thereof, said second electrode of said PMOS transistor and connected to, at another input thereof, said first electrode of said NMOS transistor via an inverter for inputting the voltage of said second electrode of said PMOS transistor and the inverted voltage of that at said first electrode of said NMOS transistor and for outputting said error indicating signal.

8. A memory device comprising:
   a memory cell group including a plurality of memory cells, said memory cells each storing data therein, and having an output node and causing an electric potential to be produced at said output node thereof according to the data stored therein;
   a plurality of discriminating circuits, each receiving an electrical potential from an output node of a corresponding memory cell in said memory cell group, for respectively discriminating between first and second logic levels of data stored in said memory cell with respect to a first threshold potential, whereby said discriminating circuits respectively generate discrimination signals each indicating one of said first and second logic levels;
   a plurality of detecting circuits, each receiving an electrical potential from an output node of a corresponding memory cell in said memory cell group, for respectively detecting that the electrical potential is between second and third threshold potentials said second threshold potential being above said first threshold potential and said third threshold potential being below said first threshold potential, whereby said detecting circuits respectively generate detection signals each indicating that said electrical potential is between said second and third threshold potentials.

9. A memory device according to claim 8, wherein data in each of said memory cells in said memory cell group is selectively erased and written at respective erasing and writing voltages;
   wherein said second threshold potential is selected to be between said first threshold potential and a maximum electrical potential generated by said memory cell after data stored therein has been erased;
   and wherein said third threshold potential is selected to be between said first threshold potential nd a minimum electrical potential generated by said memory cell after data stored therein has been written.

10. A memory device according to claim 8, wherein each of said detecting circuits comprises:
   an NMOS transistor having a first gate electrode coupled to said output node of said memory cell, a first electrode, and a second electrode coupled to a ground potential;

a PMOS transistor having a third electrode coupled to a power supply, a fourth electrode and a second gate electrode;

a resistor connected between said first and fourth electrodes;

a load element for connecting said power supply and both said first and second gate electrodes; and an AND gate circuit having first and second input terminals, said first input terminal being coupled to said fourth electrode, and said second terminal being coupled to said first electrode through an inverter, whereby said AND gate outputs said detection signal.

11. A memory device according to claim 8, further comprising:

a parity memory cell, associated with said cell group, for storing parity data therein, and having an output node and generating an electrical potential at said output node thereof according to the parity data stored therein;

and an additional discriminating circuit, for receiving said electrical potential from said output node of said parity memory cell, and for discriminating between first and second logic levels of said parity data with respect to said first threshold potential, whereby said additional discriminating circuit generates a discrimination signal in response thereto.

12. A memory device according to claim 11, further comprising:

a parity check circuit, for receiving discrimination signals from both said discriminating and additional discriminating circuits, and for detecting that an erroneous discrimination signal exists in said discrimination signals, whereby said parity check circuit generates an indication signal indicating that an erroneous discrimination signal exists;

a plurality of opposite signal generating means, responsive to said indication signal and each receiving a discrimination signal from a corresponding discriminating circuit and a detection signal from a corresponding detecting circuit, for generating an opposite signal opposed to a logic level indicated by said received discrimination signal upon said detection signal being received from said corresponding detecting circuit, whereby said erroneous discrimination signal is corrected.

13. A memory device according to claim 12, wherein each of said plurality of opposite signal generating means comprising:

an AND gate having first and second input terminals and an output terminal, said first input terminal receiving said indication signal, and said second input terminal receiving said detection signal from a corresponding detecting circuit;

an Exclusive-OR gate having first and second input terminals, said first input terminal being coupled to said output terminal of said AND gate, and said second input terminal receiving said discrimination signal.

14. A memory device according to claim 11, further comprising:

an additional detecting circuit, for receiving said electrical potential from said output node of said parity memory cell and for detecting that said electrical potential is between said second and third threshold potentials, whereby said additional detecting circuit generates a detection signal in response thereto.

15. A memory device according to claim 14, further comprising:

a parity check circuit, for receiving discrimination signals from both said discriminating and additional discriminating circuits, and for detecting that an erroneous discrimination signal exists in said discrimination signals, whereby said parity check circuit generates an indication signal indicating that an erroneous discrimination signal exists; an additional opposite signal generating means, responsive to said indication signal and receiving said discrimination signal from said additional discriminating circuit and said detection signal from said additional detecting circuit, for generating an opposite signal opposed to one of said first and second logic levels indicated by said discrimination signal upon said detection signal being received from said additional detecting circuit, whereby said erroneous discrimination signal is corrected.

16. A memory device according to claim 15, wherein said additional opposite signal generating means comprises:

an AND gate having first and second input terminals and an output terminal, said first input terminal receiving said indication signal, and said second input terminal receiving said detection signal from a corresponding detecting circuit;

an Exclusive-OR gate having first and second input terminals, said first input terminal being coupled to said output terminal of said AND gate, and said second input terminal receiving said discrimination signal.

17. A memory device comprising:

a memory cell for storing data therein, said memory cell having an output node and causing an electrical potential to be produced at said output node thereof according to the data stored therein;

a discriminating circuit, for receiving said electrical potential from said output node of said memory cell, and for discriminating between first and second logic levels of data stored in said memory cell with respect to a first threshold potential, whereby said discriminating circuit generates a discrimination signal indicating one of said first and second logic levels;

a detecting circuit, for receiving said electrical potential from said output node of said memory cell, and for detecting that said electrical potential is between second and third threshold potentials, said second threshold potential being above said first threshold potential, and said third threshold potential being below said first threshold potential, whereby said detecting circuit generates a detection signal indicating that said electrical potential is between said second and third threshold potentials.

18. A memory device according to claim 17, wherein data in said memory cell is selectively erased and written at respective erasing and writing voltages;

wherein said second threshold potential is selected to be between said first threshold potential and a maximum electrical potential generated by said memory cell after data stored therein has been erased;

and wherein said third threshold potential is selected to be between said first threshold potential and a minimum electrical potential generated by said memory cell after data stored therein has been written.

19. A memory cell device according to claim 17, wherein said detecting circuit comprises:
   an NMOS transistor having a first gate electrode coupled to said output node of said memory cell, a first electrode, and a second electrode coupled to a ground potential;
   a PMOS transistor having a third electrode coupled to a power supply, a fourth electrode and a second gate electrode;
   a resistor connected between said first and fourth electrodes;
   a load element for connecting said power supply and both said first and second gate electrodes; and
   an AND gate circuit having first and second input terminals, said first input terminal being coupled to said fourth electrode, and said second terminal being coupled to said first electrode through an inverter, whereby said AND gate outputs said detection signal.

20. A memory device according to claim 17, further comprising:
   a parity memory cell, associated with said memory cell, for storing parity data therein, and having an output node and generating an electrical potential at said output node thereof according to the parity data stored therein;
   and an additional discriminating circuit, for receiving said electrical potential from said output node of said parity memory cell, and for discriminating between first and second logic levels of said parity data with respect to the first threshold potential, whereby said additional discriminating circuit generates said discrimination signal in response thereto.

21. A memory device according to claim 20, further comprising:
   a parity check circuit, for receiving said discrimination signals from both said discriminating and additional discriminating circuits, and for detecting that an erroneous discrimination signal exists in said discrimination signals, whereby said parity check circuit generates an indication signal indicating that an erroneous discrimination signal exists;
   an opposite signal generating means, responsive to said indication signal and receiving said discrimination signal from said discriminating circuit and said detection signal from said detecting circuit, for generating an opposite signal opposed to a logic level indicated by said received discrimination signal upon said detection signal being received from said detecting circuit, whereby said erroneous discrimination signal can be corrected.

22. A memory device according to claim 21, wherein said opposite signal generating means comprises:
   an AND gate having first and second input terminals and an output terminal, said first input terminal receiving said indication signal and said second input terminal receiving said detection signal from said detecting circuit;
   an Exclusive-Or gate having first and second input terminals, said first input terminal being coupled to said output terminal of said AND gate, and said second input terminal receiving said discrimination signal.

23. A memory device according to claim 20, further comprising:
   an additional detecting circuit, for receiving said electrical potential from said output node of said parity memory cell, and for detecting that said electrical potential is between said second and third threshold potentials, whereby said additional detecting circuit generates said detection signal in response thereto.

24. A memory device according to claim 23, further comprising:
   a parity check circuit, for receiving discrimination signals from both said discriminating and additional discriminating circuits, and for detecting that an erroneous discrimination signal exists in said discrimination signals, whereby said parity check circuit generates an indication signal indicating that an erroneous discrimination signal exists;
   an additional opposite signal generating means, responsive to said indication signal and receiving said discrimination signal from said additional discriminating circuit and said detection signal from said additional detecting circuit, for generating an opposite signal opposed to one of said first and second logic levels indicated by said discrimination signal upon said detection signal being received from said additional detecting circuit, whereby said erroneous discrimination signal is corrected.

25. A memory device according to claim 24, wherein said additional opposite signal generating means comprises:
   an AND gate having first and second input terminals and an output terminal, said first input terminal receiving said indication signal, and said second input terminal receiving said detection signal from said detecting circuit;
   an Exclusive-Or gate having first and second input terminals, said first input terminal being coupled to said output terminal of said AND gate, and said second input terminal receiving said discrimination signal.

26. A memory device comprising:
   a memory cell group including a plurality of memory cells, said memory cells each storing data therein, and having an output node and causing an electrical potential to be produced at said output node according to the data stored therein;
   a plurality of discriminating circuits, each receiving an electrical potential from an output node of a corresponding memory cell in said memory cell group, for respectively discriminating between first and second logic levels of data stored in said memory cell with respect to a first threshold potential so that said discriminating circuits respectively generate discrimination signals each indicating one of said first nd second logic levels;
   a plurality of detecting circuits, each receiving an electrical potential from an output node of a corresponding memory cell in said memory cell group, for respectively detecting that the electrical potential is between second and third threshold potentials so that said detecting circuits respectively generate detection signals each indicating that the electrical potential is between second and third threshold potentials, said second threshold potential being above said first threshold potential, and said third threshold potential being below said first threshold potential.

27. A memory device according to claim 26, wherein data in each of said memory cells in said memory cell group is selectively erased and written at respective erasing and writing voltages;

wherein said second threshold potential is selected to be between said first threshold potential and a maximum electrical potential generated by said memory cell after data stored therein has been erased;

and wherein said third threshold potential is selected to be between said first threshold potential nd a minimum electrical potential generated by said memory cell after data stored therein has been written.

28. A memory device according to claim 27, wherein each of said detecting circuits comprises:

an NMOS transistor having a first gate electrode coupled to said output node of said memory cell, a first electrode, and a second electrode coupled to a ground potential;

a PMOS transistor having a third electrode coupled to a power supply, a fourth electrode and a second gate electrode;

a resistor connected between said first and fourth electrodes;

a load element for connecting said power supply and both said first and second gate electrodes; and an AND gate circuit having first and second input terminals, said first input terminal being coupled to said fourth electrode, and said second terminal being coupled to said first electrode through an inverter, whereby said AND gate outputs said detection signal.

29. A memory device according to claim 27, further comprising:

a parity memory cell, associated with said cell group, for storing parity data therein, and having an output node and generating an electrical potential at said output node thereof according to the parity data stored therein;

and an additional discriminating circuit, for receiving said electrical potential from said output node of said parity memory cell, and for discriminating between first and second logic levels of said parity data with respect to said first threshold potential, whereby said additional discriminating circuit generates a discrimination signal in response thereto.

30. A memory device according to claim 29, further comprising:

a parity check circuit, for receiving discrimination signals from both said discriminating and additional discriminating circuits, and for detecting that an erroneous discrimination signal exists in said discrimination signals, whereby said parity check circuit generates an indication signal indicating that an erroneous discrimination signal exists;

a plurality of opposite signal generating means, responsive to said indication signal and each receiving a discrimination signal from a corresponding discriminating circuit and a detection signal from a corresponding detecting circuit, for generating an opposite signal opposed to a logic level indicated by said received discrimination signal upon said detection signal being received from said corresponding detecting circuit, whereby said erroneous discrimination signal is corrected.

31. A memory device according to claim 30, wherein each of said plurality of opposite signal generating means comprises:

an AND gate having first and second input terminals and an output terminal, said first input terminal receiving said indication signal, and said second input terminal receiving said detection signal from a corresponding detecting circuit;

an Exclusive-Or gate having first and second input terminals, said first input terminal being coupled to said output terminal of said AND gate, and said second input terminal receiving said discrimination signal.

32. A memory device according to claim 29, further comprising:

an additional detecting circuit, for receiving said electrical potential from said output node of said parity memory cell and for detecting that said electrical potential is between said second and third threshold potentials, whereby said additional detecting circuit generates a detection signal in response thereto.

33. A memory device according to claim 32, further comprising:

a parity check circuit, for receiving discrimination signals from both said discriminating and additional discriminating circuits, and for detecting that an erroneous discrimination signal exists in said discrimination signals, whereby said parity check circuit generates an indication signal indicating that an erroneous discrimination signal exists;

an additional opposite signal generating means, responsive to said indication signal and receiving said discrimination signal from said additional discriminating circuit and said detection signal from said additional detecting circuit, for generating an opposite signal opposed to one of said first and second logic levels indicated by said discrimination signal upon said detection signal being received from said additional detecting circuit, whereby said erroneous discrimination signal is corrected.

34. A memory device according to claim 33, wherein said additional opposite signal generating means comprises:

an AND gate having first and second input terminals and an output terminal, said first input terminal receiving said indication signal, and said second input terminal receiving said detection signal from a corresponding detecting circuit;

an Exclusive-Or gate having first and second input terminals, said first input terminal being coupled to said output terminal of said AND gate, and said second input terminal receiving said discrimination signal.

* * * * *